United States Patent
Ichiki et al.

(10) Patent No.: US 6,909,087 B2
(45) Date of Patent: *Jun. 21, 2005

(54) METHOD OF PROCESSING A SURFACE OF A WORKPIECE

(75) Inventors: Katsunori Ichiki, Kanagawa (JP);
Kazuo Yamauchi, Kanagawa (JP);
Hirokuni Hiyama, Kanagawa (JP);
Seiji Samukawa, Miyagi (JP)

(73) Assignee: Ebara Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/471,743
(22) PCT Filed: Mar. 22, 2002
(86) PCT No.: PCT/JP02/02751
§ 371 (c)(1),
(2), (4) Date: Sep. 24, 2003
(87) PCT Pub. No.: WO02/078044
PCT Pub. Date: Oct. 3, 2002

(65) Prior Publication Data
US 2004/0094400 A1 May 20, 2004

(30) Foreign Application Priority Data
Mar. 26, 2001 (JP) .......................... 2001-88888

(51) Int. Cl.[7] .......................... H01L 21/306; H05H 3/00
(52) U.S. Cl. ................ 250/251; 250/423 R; 313/359.1; 313/362.1; 313/363.1; 315/111.21; 315/111.31
(58) Field of Search .............................. 250/251, 423 R; 313/359.1, 362.1, 363.1; 315/111.21, 111.31; 156/345.39

(56) References Cited

U.S. PATENT DOCUMENTS

| 4,158,589 A | 6/1979 | Keller et al. |
| 4,250,009 A | 2/1981 | Cuomo et al. |

(Continued)

FOREIGN PATENT DOCUMENTS

| DE | 199 29 278 | 2/2000 |
| EP | 0 340 998 | 11/1989 |

(Continued)

OTHER PUBLICATIONS

European Patent Office, Patent Abstracts of Japan, Publication No. 02097664, dated Apr. 10, 1990. Cited in the international search report.

Kanakasabapathy et al.; Applied Physics Letters, vol. 78, No. 1, pp. 22–24, Jan. 1, 2001. Cited in the international search report.

*Primary Examiner*—Nikita Wells
(74) *Attorney, Agent, or Firm*—Westerman, Hattori, Daniels & Adrian, LLP

(57) ABSTRACT

A plasma generator generates positive ions and negative ions in a plasma. An ion extracting portion (4, 5) selectively extracts the generated positive ions and negative ions from the plasma, and accelerates the extracted ions in a predetermined direction. The positive ions and the negative ions are selectively applied to the workpiece (X). The plasma generator applies a high-frequency voltage to a process gas in a vacuum chamber for generating a plasma which is composed of positive ions and electrons from the process gas, and interrupts the high-frequency voltage for attaching the electrons to the residual process gas to generate negative ions. The application of the high-frequency voltage and the interruption of the high-frequency voltage are alternately repeated.

17 Claims, 4 Drawing Sheets

U.S. PATENT DOCUMENTS

| | | | |
|---|---|---|---|
| 5,518,572 A * | 5/1996 | Kinoshita et al. ...... | 156/345.34 |
| 5,818,040 A | 10/1998 | Kinoshita et al. | |
| 5,827,435 A | 10/1998 | Samukawa | |
| 5,928,528 A | 7/1999 | Kubota et al. | |
| 6,217,703 B1 | 4/2001 | Kitagawa | |
| 2004/0070348 A1 * | 4/2004 | Ichiki et al. ............ | 315/111.21 |
| 2004/0108469 A1 * | 6/2004 | Ichiki et al. ........... | 250/492.21 |
| 2004/0108470 A1 * | 6/2004 | Ichiki et al. ........... | 250/492.21 |

FOREIGN PATENT DOCUMENTS

| | | |
|---|---|---|
| EP | 1 220 272 | 7/2002 |
| JP | 10-83899 | 3/1998 |
| JP | 2000-100790 | 4/2000 |
| WO | WO 97/16946 | 5/1997 |
| WO | WO 01/06534 | 1/2001 |

* cited by examiner

METHOD OF PROCESSING A SURFACE OF A WORKPIECE

TECHNICAL FIELD

The present invention relates to a method of processing a surface of a workpiece in micromachining processes involved in the fabrication of semiconductor devices or the like, and more particularly to a method of processing a surface of a workpiece with use of positive and negative ions generated in a plasma or neutral particles generated by neutralizing the positive and negative ions.

BACKGROUND ART

In recent years, semiconductor integrated circuits, information storage media such as hard disks, micromachines, and the like have been processed in highly fine patterns. In the fields of processing such workpieces, there has widely been used an etching apparatus utilizing a plasma.

As an etching apparatus utilizing a plasma, there has been known an etching apparatus which generates various kinds of beams including a positive ion beam and a radical beam. The positive ion beam or the radical beam is applied to a workpiece, for thereby depositing a film on the workpiece, etching the workpiece, modifying the surface of the workpiece.

One of the most serious problems in the etching process using a high-density plasma is charge build-up damage caused by charges accumulated on the surface of the workpiece. The charge build-up damage is caused due to the difference between the behaviors of electrons and positive ions. Specifically, since electrons have a higher energy and a higher velocity than positive ions, the electrons reach the workpiece faster than the positive ions, so that a negative potential is developed on the surface of the workpiece. The negative potential thus developed accelerates the positive ions and decelerates the electrons. At this time, those electrons which are decelerated to become nondirectional cannot be introduced into fine patterns on the surface of the workpiece, but only the positive ions reach the bottom of the fine patterns. Therefore, a positive charge build-up is developed on the workpiece to cause etching profile irregularities or charge build-up damage.

DISCLOSURE OF INVENTION

The present invention has been made in view of the above drawbacks. It is therefore an object of the present invention to provide a method of processing a surface of a workpiece by applying an energetic beam having a large beam diameter to the workpiece with an inexpensive and compact structure, for thereby accurately processing the workpiece in a fine pattern without a charge build-up or damage.

In order to attain the above object, according to a first aspect of the present invention, there is provided a method of processing a surface of a workpiece, comprising: generating positive ions and negative ions in a plasma; selectively extracting the generated positive ions and negative ions from the plasma, and accelerating the extracted ions in a predetermined direction; and selectively applying the positive ions and the negative ions to the workpiece.

According to the present invention, the positive and negative ions are alternately extracted from the plasma and applied to the workpiece. Alternatively, these ions may be neutralized and converted into neutral particles, and the neutral particles may be applied as a neutral particle beam to the workpiece. In the fabrication of a semiconductor device or the like, when the workpiece is processed with the method according to the present invention, damage caused by charges accumulated on the surface of the workpiece can be reduced. Further, the adverse effects caused by radicals can be reduced, and the path of the ion beam can be collimated.

According to a preferred aspect of the present invention, the generating comprises: applying a high-frequency voltage to a process gas in a vacuum chamber for generating a plasma which is composed of positive ions and electrons from the process gas; interrupting the high-frequency voltage for attaching the electrons to the residual process gas to generate negative ions; and repeating the application of the high-frequency voltage and the interruption of the high-frequency voltage.

According to another preferred aspect of the present invention, the generating comprises: generating a plasma which is composed of positive ions and electrons from a process gas in a vacuum chamber; and attaching the electrons to the residual process gas to generate negative ions at a downstream part of a plasma generated space.

Thus, after a plasma which is composed of positive ions and electrons is generated from the process gas, the electrons are attached to the residual process gas to generate negative ions. Therefore, negative ions can efficiently be generated in the plasma with a simple structure. Accordingly, a plasma comprising a mixture of positive ions and negative ions can be generated.

According to another preferred aspect of the present invention, the positive ions and the negative ions are alternately extracted from the plasma and alternately applied to the workpiece.

The positive ions and the negative ions have substantially the same mass. Therefore, the positive ions and the negative ions can alternately be extracted from a plasma comprising a mixture of positive ions and negative ions and accelerated in an AC or DC pulsed electric field having a frequency of 1 MHz or lower, preferably 600 kHz or lower. At this time, accumulated charges are reduced on the surface of the workpiece, for thereby suppressing etching profile irregularities or charge build-up damage. Therefore, the workpiece can be processed in a fine pattern having a higher aspect ratio.

For example, gases having atoms and molecules that are liable to become positive ions include a Xe gas of a rare gas, and gases having atoms and molecules that are liable to become negative ions include a chlorine gas of a halogen gas. When a plasma of positive and negative ions is generated with use of the mixture of these types of gases, e.g., with use of a gas containing chlorine and Xe therein, most of the positive ions in the plasma are $Xe^+$ and most of the negative ions in the plasma are $Cl^-$. With such a plasma, when the positive ions and the negative ions are alternately neutralized, a Xe beam and a chlorine beam can alternately be applied to the workpiece. Such a method has the following advantages.

(1) A etching rate can be enhanced by chemical sputtering effect.

(2) A damage-free process can be realized.

For example, a chlorine beam is applied to a workpiece to form thereon several atomic layers in which the chlorine and the workpiece are weakly bonded to each other, and then a Xe beam is applied to the workpiece. When the energy of the Xe beam is larger than the energy required for removing the atomic layers in which the chlorine and the workpiece are weakly bonded to each other, but is smaller than the energy required for removing the atomic layers in the workpiece which have a large bonding strength, the Xe beam can sputter the workpiece to remove only the atomic layers in which the chlorine and the workpiece are weakly bonded to each other. Thus, when reaction processes are properly selected and the energy of a beam is properly controlled, a workpiece can be etched without defect of the crystal structure of atoms in the workpiece according to the damage-free process.

According to a second aspect of the present invention, there is provided a method of processing a surface of a workpiece, comprising: generating positive ions and negative ions in a plasma; selectively extracting the generated negative ions from the plasma, and accelerating the extracted negative ions in a predetermined direction; and applying the negative ions to the workpiece.

It has been known in the art that negative ions apply a lower charge build-up voltage on the surface of the workpiece in comparison with positive ions. By selectively extracting only the negative ions and applying the negative ions to the workpiece, it is possible to process the workpiece with less charge build-up damage in micromachining processes involved in the fabrication of a semiconductor device or the like.

The method of processing a surface of a workpiece according to the present invention is useful to improve the reactivity in etching noble metals in a fine pattern. Noble metals such as Pt and films having a high dielectric constant are expected to be used as new materials in the fabrication of semiconductor devices. Since these materials have a low volatility, even if a plasma generated from a chlorine gas is used, these materials are not etched by chemical sputtering effect, but by physical sputtering effect. Therefore, a redeposition film is formed on a sidewall, resulting in degraded properties of the device. Further, these materials have a low selectivity over a mask. In order to solve the above drawbacks, it has been attempted to increase the temperature of the workpiece to about 200 to about 300° C. for thereby improving the reactivity.

However, although the reactivity can be improved to a certain extent according to the above method, the above method requires a hard mask and excessively complicated processes. A negative ion beam is effective to solve these drawbacks. The negative ions carry electrons having an extremely low energy to the semiconductor substrate as the workpiece and are attached to chlorides on the surface of the substrate (Pt), for thereby converting reaction products into negative ions. As a result, the energy required for releasing the reaction products from the surface of the substrate can be lowered to about one-tenth.

Further, the method of processing a surface of a workpiece according to the present invention is effective to reduce charge build-up damage in an element doping process such as ion implantation. In the case where a substrate is processed in a fine pattern, charges: are highly accumulated on the substrate due to a secondary electron emission, resulting in the problem of charge build-up damage. It has been known that negative ions have a smaller probability of the secondary electron emission in comparison with positive ions. Therefore, when negative ions are used in the ion implantation, charge build-up damage can effectively be controlled. Further, a damage-free doping process having a high performance can be achieved by alternate implantation of positive ions and negative ions.

According to a third aspect of the present invention, there is provided a method of processing a surface of a workpiece, comprising: generating positive ions and negative ions in a plasma; alternately extracting the generated positive ions and negative ions from the plasma, and accelerating the extracted ions in a predetermined direction; neutralizing the accelerated ions to convert them into neutral particles; and applying the neutral particles to the workpiece.

According to a fourth aspect of the present invention, there is provided a method of processing a surface of a workpiece, comprising: generating positive ions and negative ions in a plasma; selectively extracting the generated negative ions from the plasma, and accelerating the extracted negative ions in a predetermined direction; neutralizing the accelerated negative ions to convert them into neutral particles; and applying the neutral particles to the workpiece.

According to the present invention, ions are converted into neutral particles, and the neutral particles are applied as a neutral particle beam to the workpiece. Therefore, charge build-up damage can be reduced, and the workpiece can be processed with less damage.

According to a preferred aspect of the present invention, the ions or the neutral particles produced by neutralizing the ions are applied to the workpiece while the workpiece is being shielded from a radiation produced by the plasma. With this method, the workpiece can be processed in a fine pattern without damage caused by ultraviolet radiation produced by the plasma.

According to a preferred aspect of the present invention, the workpiece comprises a semiconductor device, and the ions or the neutral particles produced by neutralizing the ions are applied to the semiconductor device for forming a gate dielectric film thereon. In forming a gate dielectric film in a semiconductor device, when positive and negative ions are alternately applied or neutral particles are applied to the workpiece, the workpiece can be processed with less damage caused by accumulated charges. Therefore, the semiconductor device can be processed in a finer pattern. A dielectric film having good quality can be formed by a deposition process in the method according to the present invention.

According to another preferred aspect of the present invention, the workpiece comprises an organic material, and the ions or the neutral particles produced by neutralizing the ions are applied to the organic material for etching the organic material. With this method, undesirable radicals are prevented from reaching the workpiece, and the workpiece can be etched in such a manner that a subsequent process is not adversely affected. Accordingly, a semiconductor device or the like can be processed in a finer pattern.

The above and other objects, features, and advantages of the present invention will be apparent from the following description when taken in conjunction with the accompanying drawings which illustrates preferred embodiments of the present invention by way of example.

BEST MODE FOR CARRYING OUT THE INVENTION

A processing apparatus for carrying out a method of processing a surface of a workpiece according to a first embodiment of the present invention will be described in detail below with reference to FIGS. 1 through 4.

Figure 1:
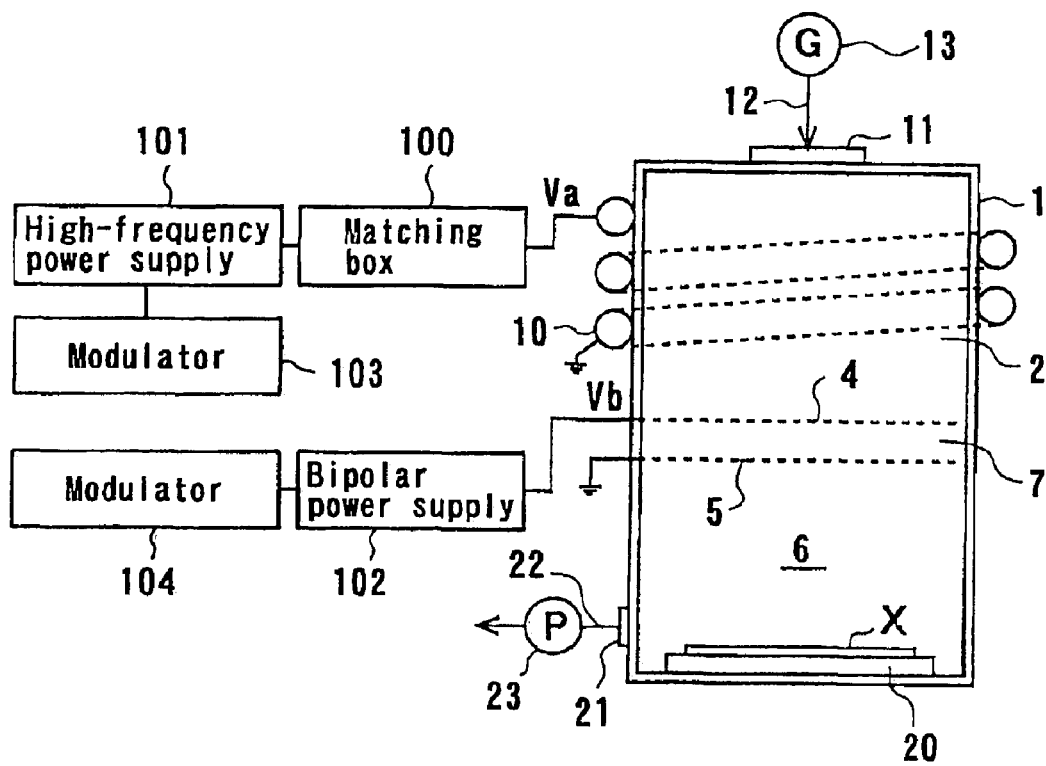
FIG. 1 is a schematic view showing a whole arrangement of a processing apparatus for carrying out a method of processing a surface of a workpiece according to a first embodiment of the present invention.

FIG. 1 is a schematic view showing a whole arrangement of a processing apparatus according to a first embodiment of the present invention, with electric components in block form. As shown in FIG. 1, the processing apparatus comprises a cylindrical vacuum chamber 1 having a process gas inlet port 11 for introducing a process gas into the vacuum chamber 1. The vacuum chamber 1 has a plasma generating chamber 2 defined therein for generating positive ions, negative ions, and electrons from the introduced process gas, and an ion extracting portion 7 for extracting the generated positive or negative ions and accelerating the generated positive or negative ions in a predetermined direction. The vacuum chamber 1 also has a process chamber 6 defined therein for processing a workpiece X such as a semiconductor substrate, a glass workpiece, an organic workpiece, a ceramic workpiece, or the like. The ions that have been extracted and accelerated by the ion extracting portion 7 are applied to the workpiece X in the process chamber 6. The vacuum chamber 1 has walls made of quartz glass, ceramics, or the like.

The process chamber 6 houses a workpiece holder 20 therein for holding the workpiece X. The workpiece X is placed on an upper surface of the workpiece holder 20. The process chamber 6 has a gas outlet port 21 defined in a sidewall thereof for discharging the gas from the process chamber 6. The gas outlet port 21 is connected through a gas outlet pipe 22 to a vacuum pump 23, which operates to maintain the plasma generating chamber 2, the ion extracting portion 7, and the process chamber 6 at a predetermined pressure.

The gas inlet port 11 defined in an upper portion of the plasma generating chamber 2 is connected through a gas supply pipe 12 to a gas supply source 13, which supplies a gas such as $SF_6$, $CHF_3$, $CF_4$, $Cl_2$, Xe, $O_2$, $N_2$, and $C_4F_8$ to the plasma generating chamber 2.

The plasma generating chamber 2 has a coil 10 disposed therearound for inductively coupled plasma (ICP). The coil 10 is housed in a water-cooled tube having an outside diameter of 8 mm, for example. The coil 10 of about two turns is wound around the plasma generating chamber 2. The coil 10 is electrically connected through a matching box 100 to a high-frequency power supply 101, which applies a high-frequency voltage having a frequency of about 13.56 MHz, for example, to the coil 10. When a high-frequency current is supplied from the high-frequency power supply 101 via the matching box 100 to the coil 10, an induced magnetic field is produced in the plasma generating chamber 2 by the coil 10. The varying magnetic field induces an electric field. The electric field accelerates electrons, which ionizes atoms and molecules in the process gas to generate a plasma in the plasma generating chamber 2. Thus, the coil 10, the matching box 100, and the high-frequency power supply 101 constitute a plasma generator for generating a plasma from the process gas in the plasma generating chamber 2. The generated plasma is mainly composed of positive ions and heated electrons which coexist therein. In the plasma generating chamber 2, electrons generated in the plasma are attached to the residual gas to generate a large quantity of negative ions.

A thin-plate grid electrode 4 made of an electrically conductive material is disposed in the lower end of the plasma generating chamber 2. The grid electrode 4 is electrically connected to a bipolar power supply (voltage applying unit) 102. Another grid electrode 5 is disposed below the grid electrode 4 and electrically grounded. The ion extracting portion 7 for extracting positive or negative ions and accelerating the positive or negative ions in a predetermined direction is provided downstream of the plasma generating chamber 2. The ion extracting portion 7 is constituted by the grid electrodes 4, 5, for example. A positive or negative accelerating voltage is applied to the grid electrode 4 by the bipolar power supply 102.

Figure 2A:
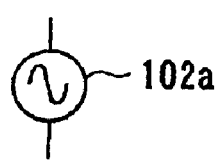
FIGS. 2A through 2C are schematic views showing various bipolar power supplies used in an ion extracting portion.
Figure 2B:
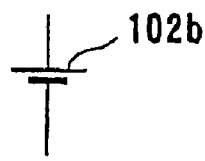
Figure 2C:
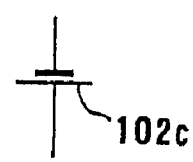

FIGS. 2A through 2C show various bipolar power supplies. When an AC voltage is applied to the grid electrode 4 by the bipolar power supply 102a shown in FIG. 2A, positive ions and negative ions are alternately extracted from the plasma generating chamber 2 and accelerated toward the downstream process chamber 6. When a positive DC voltage is applied to the grid electrode 4 by the bipolar power supply 102b shown in FIG. 2B, positive ions are extracted from the plasma generating chamber 2 and accelerated toward the downstream process chamber 6. When a negative DC voltage is applied to the grid electrode 4 by the bipolar power supply 102c shown in FIG. 2C, negative ions are extracted from the plasma generating chamber 2 and accelerated toward the downstream process chamber 6.

The high-frequency power supply 101 which is connected to the coil 10 is connected a modulator 103, and the bipolar power supply 102 which is connected to the grid electrode 4 is connected to a modulator 104. Thus, the high-frequency power supply 101 and the bipolar power supply 102 are connected to each other through th modulators 103, 104. The application of the voltage by the bipolar power supply 102 is synchronized with the application of the voltage by the high-frequency power supply 101, based on synchronizing signals transmitted between the modulators 103, 104.

The ions that have passed through the grid electrode 5 are emitted as an energetic beam into the process chamber 6. The ion beam travels directly in the process chamber 6 and is applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

Figure 3:
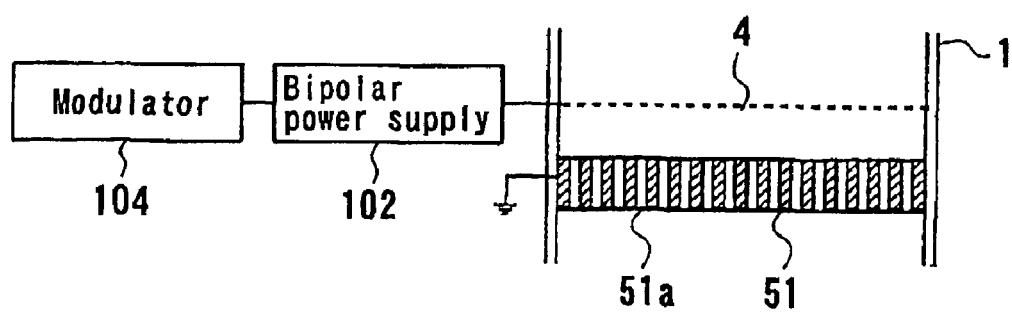
FIG. 3 is a fragmentary view showing an example of an ion extracting portion and a neutralization device.

The ion beam generated through the grid electrode 4 may be neutralized to generate a neutral particle beam. For example, an orifice electrode made of an electrically conductive material may be used as a neutralization device for neutralizing the ion beam, as shown in FIG. 3. In FIG. 3, the orifice electrode 51 is disposed instead of the grid electrode 5. The orifice electrode 51 has a number of orifices 51a defined therein. Ions accelerated by the grid electrode 4 are introduced into the orifices 51a defined in the orifice electrode 51. Most of the ions that are passing through the orifices 51a in the orifice electrode 51 are neutralized by exchanging electrons with the sidewall surfaces of the orifices 51a, or by charge exchange with gas molecules remaining within the orifices 51a. Thus, the ions are converted into neutral particles.

The neutral particles that have passed through the orifice electrode 51 are emitted as a neutral particle beam into the process chamber 6. The neutral particle beam travels directly in the process chamber 6 and is applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

Figure 4:
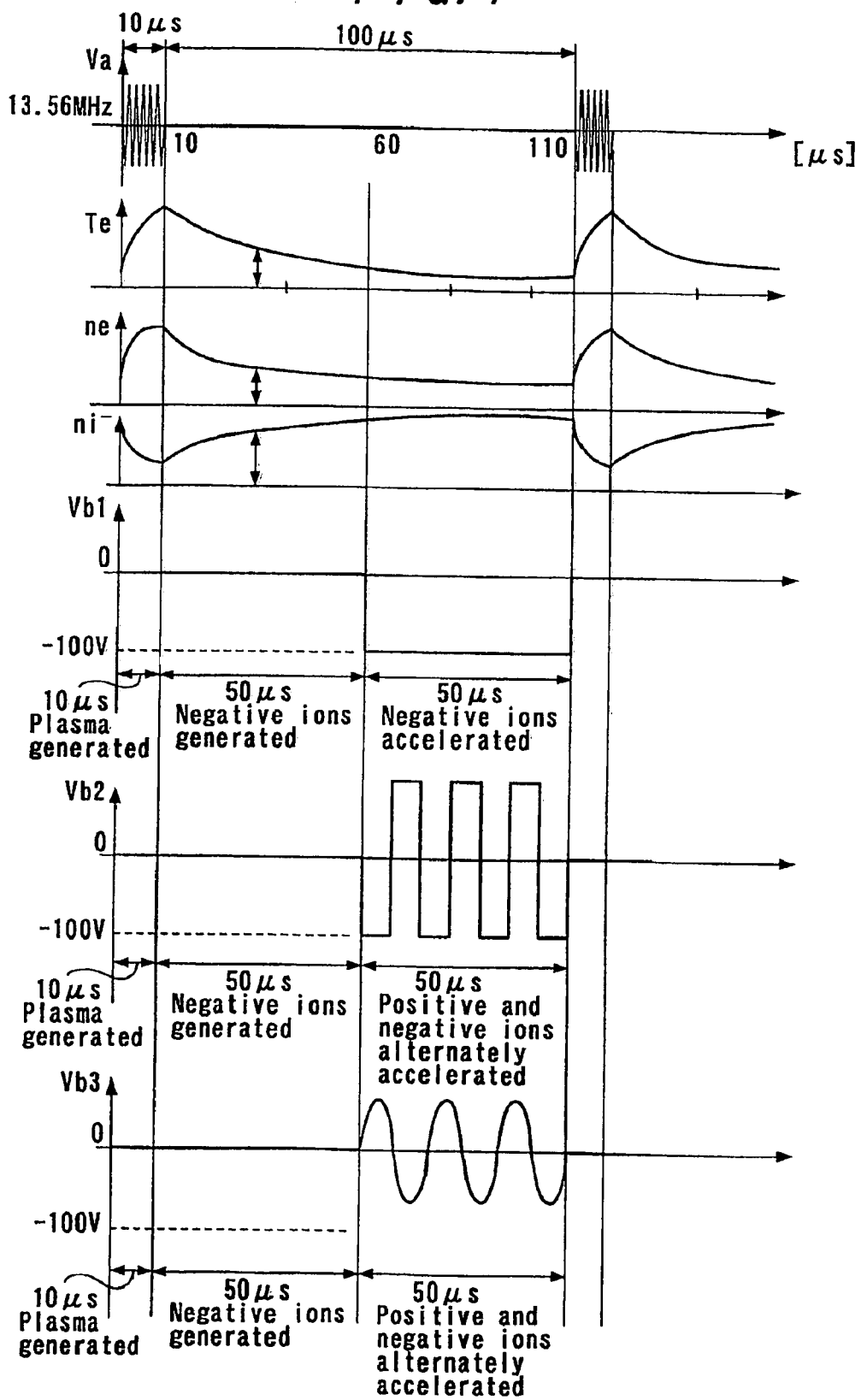
FIG. 4 is a timing chart showing operating states of the processing apparatus shown in FIG. 1.

Operation of the processing apparatus according to the first embodiment will be described below. FIG. 4 is a timing chart showing timing chart showing operating states of the processing apparatus shown in FIG. 1. In FIG. 4, Va represents the potential of the coil 10, Te the electron temperature in the plasma generating chamber 2, ne the electron density in the plasma generating chamber 2, ni⁻the negative ion density in the plasma generating chamber 2, and Vb1, Vb2 and Vb3 the potentials of the grid electrode 4. The timing chart is schematically shown in FIG. 4, and the shown frequencies are different from the actual frequencies, for example.

The vacuum pump 23 is driven to evacuate the vacuum chamber 1. After the vacuum chamber 1 reaches a predetermined degree of vacuum, a gas such as $SF_6$, $CHF_3$, $CF_4$, $Cl_2$, Ar, $O_2$, $N_2$, or $C_4F_8$ is introduced from the gas supply source 13 into the plasma generating chamber 2. As shown in FIG. 4, a high-frequency voltage having a frequency of about 13.56 MHz is applied to the coil 10 for 10 microseconds by the high-frequency power supply 101, so that a high-frequency electric field is produced in the plasma generating chamber 2. The gas introduced into the plasma generating chamber 2 is ionized by electrons that are accelerated by the high-frequency electric field, for thereby generating a high-density plasma in the plasma generating chamber 2. The plasma is mainly composed of positive ions and heated electrons.

Then, the high-frequency voltage applied by the high-frequency power supply 101 is interrupted for 100 microseconds. The period of time (100 microseconds) for which the high-frequency voltage is interrupted is sufficiently longer than a period of time in which the electrons in the plasma are attached to the residual process gas to generate negative ions, and sufficiently shorter than a period of time in which the electron density in the plasma is lowered to extinguish the plasma. The period of time (10 microseconds) for which the high-frequency voltage is applied is long enough to recover the energy of the electrons in the plasma which has been lowered during the interruption of the high-frequency voltage.

By interrupting the high-frequency voltage (for 100 microseconds) after the energy of the electrons is increased in the plasma (for 10 microseconds), the electrons in the plasma are attached to the residual process gas to generate negative ions.

After the interruption of the high-frequency voltage, the high-frequency voltage is applied again to the coil 10 for 10 microseconds by the high-frequency power supply 101 to heat the electrons in the plasma in the plasma generating chamber 2. A high-density plasma which is mainly composed of positive ions and heated electrons is generated in the plasma generating chamber 2. Thus, the above cycle is repeated. In this manner, the application of the high-frequency voltage for 10 microseconds and the interruption of the high-frequency voltage for 100 microseconds are alternately repeated to generate negative ions efficiently and continuously. While ordinary plasmas are mostly composed of positive ions and electrons, the processing apparatus according to the present embodiment can efficiently generate a plasma in which positive ions and negative ions coexist therein. Although the high-frequency voltage is interrupted for 100 microseconds in the example shown in FIG. 4, it may be interrupted for a period of time ranging from 50 to 100 microseconds to generate a large quantity of negative ions as well as positive ions in the plasma.

After 50 microseconds from the time when the high-frequency voltage applied by the high-frequency power supply 101 is stopped, a DC voltage of −100 V is applied to the grid electrode 4 for 50 microseconds by the bipolar power supply 102 (see Vb1 shown in FIG. 4). The application of the DC voltage lowers the potential Vb1 of the grid electrode 4 below the potential of the grid electrode 5. Thus, a potential difference is produced between the grid electrode 4 and the grid electrode 5. This potential difference serves to accelerate negative ions from the grid electrode 4 toward the grid electrode 5. Therefore, the negative ions present between the grid electrode 4 and the grid electrode 5 are accelerated toward the grid electrode 5 by the potential difference and introduced into the mesh defined in the grid electrode 5. Then, the negative ions pass through the mesh defined in the grid electrode 5 into the process chamber 6.

On the contrary, when a DC voltage of +100 V is applied to the grid electrode 4 for 50 microseconds by the bipolar power supply 102, a potential difference serving to accelerate positive ions from the grid electrode 4 toward the grid electrode 5 is produced between the grid electrode 4 and the grid electrode 5. Therefore, the positive ions present between the grid electrode 4 and the grid electrode 5 are accelerated toward the grid electrode 5 by the potential difference and introduced into the mesh defined in the grid electrode 5. Then, the positive ions pass through the mesh defined in the grid electrode 5 into the process chamber 6.

Alternatively, when the positive and negative DC voltages are alternately applied by the bipolar power supply 102 (see Vb2 shown in FIG. 4), a positive ion beam and a negative ion beam are alternately applied to the workpiece in the process chamber 6 during a latter period of 50 microseconds within the cycle time of 110 microseconds. Similarly, when an AC voltage is applied by the bipolar power supply 102 to the grid electrode 4 (see Vb3 shown in FIG. 4), a positive ion beam and a negative ion beam are alternately applied to the workpiece in the process chamber 6.

Since the accelerating voltage applied to the ions depends on the voltage which is applied between the grid electrodes 4, 5 by the bipolar power supply 102, it is possible to emit an ion beam at a desired energy level into the process chamber 6 by setting the voltage applied between the grid electrodes 4, 5 to a desired value.

As shown in FIG. 3, when the orifice electrode 51 is disposed instead of the grid electrode 5, a neutral particle beam generated by neutralizing the ions can be applied to the workpiece in the process chamber 6. Specifically, the ions accelerated between the orifice electrode 51 and the grid electrode 4 pass through the orifices 51a in the orifice electrode 51. Most of the ions that pass through the orifices 51a collide with the sidewall surfaces of the orifices 51a and are hence neutralized near the sidewall surfaces of the orifices 51a, or collide with gas molecules remaining within the orifices 51a and are hence neutralized by charge exchange with the gas molecules. In this manner, the ions are converted into neutral particles.

The ions that have been neutralized when passing through the orifices 51a, i.e., the neutral particles, are then emitted as an energetic beam into the process chamber 6. The neutral particle beam travels directly in the process chamber 6 and is applied to the workpiece X placed on the workpiece holder 20. The energy level of the neutral particle beam and the polarity of the extracted ions depend on the magnitude and polarity of the accelerating voltage applied to the grid electrode 4. Therefore, by properly changing the energy of the accelerating voltage and the polarity of the extracted ions, the processing apparatus can perform various processes including modifying the surface of the workpiece, depositing a film on the workpiece, and etching the surface of the workpiece.

The orifice electrode 51 serves not only to neutralize the ions, but also to prevent a radiation produced by the plasma from being applied to the workpiece X. Specifically, since the plasma generating chamber 2 where the plasma is generated is optically isolated from the workpiece X by the orifice electrode 51, the radiation produced by the plasma is not substantially applied to the workpiece X. Therefore, it is possible to reduce adverse effects on the workpiece X due to the radiation such as an ultraviolet ray which would otherwise damage the workpiece X.

The orifice electrode 51 also serves to prevent radicals generated in the plasma from reaching the workpiece X. Specifically, since radicals generated in the plasma have no charges and move isotropically, there is a high probability that the radicals collide with the sidewall surfaces of the orifices 51a and are inactivated when passing through the orifices 51a. Therefore, undesirable radicals are prevented from being attached to the surface of the workpiece X and adversely affecting the surface of the workpiece X.

The orifice electrode 51 should preferably have a thickness which is at least twice the diameter of the orifices 51a. When the orifice electrode 51 has a thickness which is at least twice the diameter of the orifices 51a, it is possible to increase the probability that the negative ions are neutralized in the orifices 4a, and to reduce the intensity of a radiation applied to the workpiece X from the plasma remarkably.

Some charged particles may pass through the orifices 51a in the orifice electrode 51. In order to prevent such charged particles from being applied to the workpiece X, a deflector or an electron trap may be disposed downstream of the orifice electrode 51. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the plasma generating chamber 2 according to the type of process to be performed on the workpiece X. For example, in a dry etching process, oxygen or a halogen gas may selectively be used according to the kind of the workpiece X.

In the present embodiment, it is desirable to introduce a gas that is liable to generate negative ions, such as $O_2$, $Cl_2$, $SF_6$, $CHF_3$, or $C_4F_8$, into the plasma generating chamber 2. When the application of the high-frequency voltage is interrupted after a high-density plasma is generated by the aforementioned high-frequency inductive coupling (ICP) with use of the above gas, a large number of negative ions can be generated in the plasma. Therefore, it is easy to accelerate and neutralize the negative ions.

Figure 5:
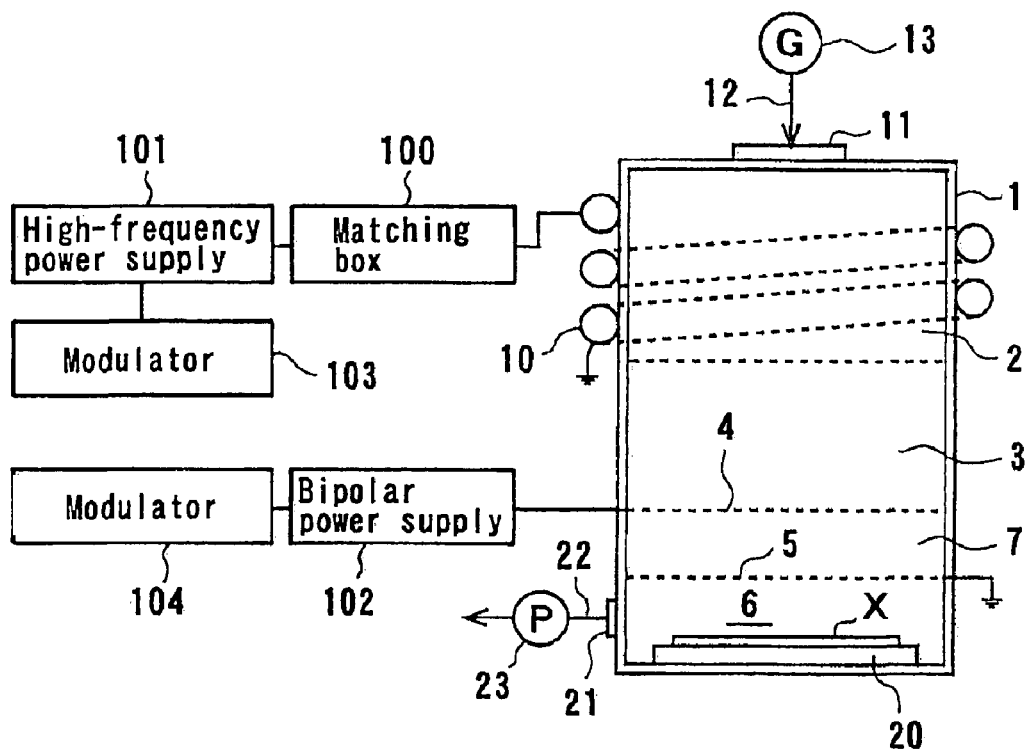
FIG. 5 is a schematic view showing a whole arrangement of a processing apparatus for carrying out a method of processing a surface of a workpiece according to a second embodiment of the present invention.

A processing apparatus according to a second embodiment of the present invention will be described below with reference to FIG. 5. FIG. 5 is a schematic view showing a whole arrangement of a processing apparatus according to a second embodiment of the present invention, with electric components in block form. In FIG. 5, like parts and components are denoted by the same reference numerals and characters as those of the first embodiment and will not be described below.

In the processing apparatus according to the second embodiment, a plasma which is composed of positive ions and electrons is generated from the process gas in the vacuum chamber 1, and the electrons are attached to the residual process gas in a downstream part of the plasma generated space to generate negative ions in the plasma. Since other details of the processing apparatus according to the second embodiment are identical to those of the processing-apparatus according to the first embodiment, only the different features of the processing apparatus according to the second embodiment will be described below.

As shown in FIG. 5, the vacuum chamber 1 has a plasma generating chamber 2 defined therein for generating positive ions and electrons from the introduced process gas, a negative ion generating chamber 3 disposed downstream of the plasma generating chamber 2 for attaching electrons generated in the plasma generating chamber 2 to the residual process gas to generate negative ions, and an ion extracting portion 7 for extracting the generated positive or negative ions and accelerating the generated positive or negative ions in a predetermined direction.

As with the first embodiment, the vacuum chamber 1 also has a process chamber 6 for processing a workpiece X such as a semiconductor substrate, a glass workpiece, an organic workpiece, a ceramic workpiece, or the like. The ions that have been extracted and accelerated by the ion extracting portion 7 are applied to the workpiece X in the process chamber 6. The grid electrode 5 may be replaced with the orifice electrode 51 shown in FIG. 3. As with the first embodiment, an ion beam of desired polarity at a desired energy level can be generated, or a neutral particle beam can be generated by neutralizing the ions.

The plasma generating chamber 2 has a coil 10 disposed therearound for inductively coupled plasma (ICP). When a high-frequency current is supplied from the high-frequency power supply 101 via the matching box 100 to the coil 10, an induced magnetic field is produced in the plasma generating chamber 2 by the coil 10. The varying magnetic field induces an electric field. The electric field accelerates electrons, which ionizes atoms and molecules in a process gas to generate a plasma in the plasma generating chamber 2. The generated plasma is mainly composed of positive ions and heated electrons which coexist therein. In the negative ion generating chamber 3, electrons generated in the plasma are attached to the residual gas to generate a large quantity of negative ions.

The plasma generating chamber 2 and the negative ion generating chamber 3 are integrally combined contiguously with each other, and the negative ion generating chamber 3 is disposed downstream of the plasma generating chamber 2. The process gas is continuously supplied into the plasma generating chamber 2 from the upstream end of the plasma generating chamber 2, for thereby continuously generating a plasma which is mainly composed of positive ions and electrons. The generated plasma is continuously delivered into the negative ion generating chamber 3 disposed downstream of the plasma generating chamber 2. In the negative ion generating chamber 3, a large number of electrons having a lowered electron temperature are attached to molecules or atoms of the residual gas, for thereby generating negative ions. Therefore, a plasma comprising a mixture of positive ions generated in the plasma generating chamber 2, negative ions generated in the negative ion generating chamber 3, and electrons is generated in the negative ion generating chamber 3.

Figure 6A:
FIG. 6A is an axial cross-sectional view showing an electron cloud generator.
Figure 6B:
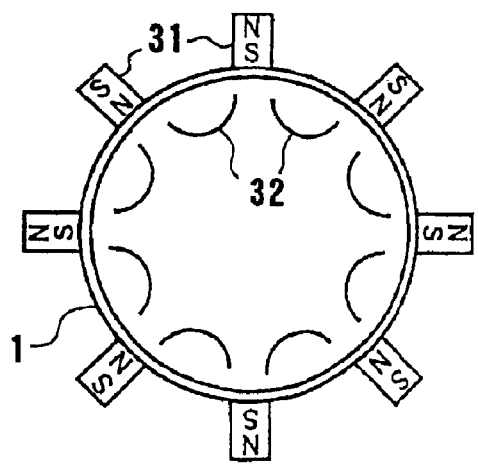
FIG. 6B is a radial cross-sectional view of the electron cloud generator shown in FIG. 6A.

The negative ion generating chamber 3 should preferably comprise an electron cloud generator for lowering the probability that electrons collide with the sidewall surfaces of the negative ion generating chamber 3 and are inactivated and for increasing the probability that electrons are attached to the residual gas. FIGS. 6A and 6B show an example of an electron cloud generator. FIG. 6A is an axial cross-sectional view, and FIG. 6B is a radial cross-sectional view. As shown in FIGS. 6A and 6B, permanent magnets 31 are disposed around the negative ion generating chamber 3 at predetermined circumferential intervals. The permanent magnets 31 are arranged so that the magnetic poles of the adjacent permanent magnets are opposed to each other. With this arrangement, the permanent magnets 31 produce a magnetic field in the negative ion generating chamber 3 as illustrated by lines 32 of magnetic force in FIG. 6B. Since electrons in the plasma move along the lines 32 of magnetic force, the electrons are prevented from contacting the inner sidewall surface of the negative ion generating chamber 3. Thus, an electron cloud is formed at positions away from the inner sidewall surface of the negative ion generating chamber 3. This electron cloud lowers the probability that electrons collide with the inner sidewall surface of the negative ion generating chamber 3 and are inactivated, for thereby efficiently generating negative ions in the negative ion generating chamber 3.

In the above embodiments, the orifice electrode is used as a neutralization device for neutralizing ions. However, the neutralization device is not limited to the illustrated example. The present invention is also applicable to various neutralization devices.

A process of forming a gate dielectric film on a semiconductor device and a process of etching an organic material with use of the processing apparatus according to the first and second embodiments will be described below with reference to FIGS. 7 and 8.

Figure 7:
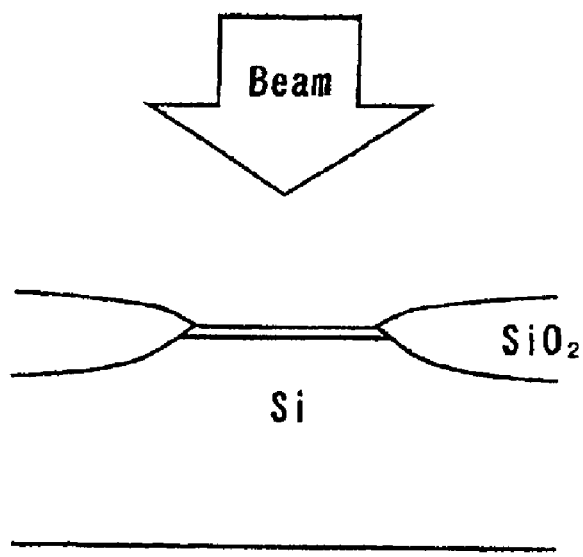
FIG. 7 is a schematic diagram explanatory of a process of forming a gate dielectric film in a semiconductor device with the method of processing a surface of a workpiece according the present invention.

FIG. 7 is a schematic diagram explanatory of a process of forming a gate dielectric film in a semiconductor device according to the method of the present invention. In FIG. 7, a positive ion beam and a negative ion beam are alternately extracted from a plasma and applied to a workpiece (silicon substrate), or a neutral particle beam is applied to the workpiece, for thereby reducing a charge build-up damage effectively. Further, when a shield such as an orifice electrode is disposed between the workpiece and the plasma, a photon radiation produced by the plasma is prevented from being applied to the workpiece, for thereby suppressing an increase in interfacial states due to the radiation such as an ultraviolet ray. For nitriding or oxidizing a gate dielectric film, negative ions are more reactive than positive ions and can thus form an accurate thin film on the silicon substrate. Therefore, when negative ions are selectively extracted from the plasma for processing the surface of the workpiece, a gate dielectric film having good quality can be formed.

In an etching process of a gate electrode or a deposition process (e.g., nitriding process or oxidizing process) of a gate dielectric film with use of an ordinary high-density plasma, the properties of the device are degraded because of charge build-up damage caused by charges accumulated on the surface of the dielectric film, and because of an increased concentration of the interfacial state which is caused by production of pairs of hole and electron in the dielectric film. According to the method of the present invention, it is possible to reduce charge build-up damage and radiation damage and to form a gate dielectric film having good quality in a semiconductor device.

Figure 8:
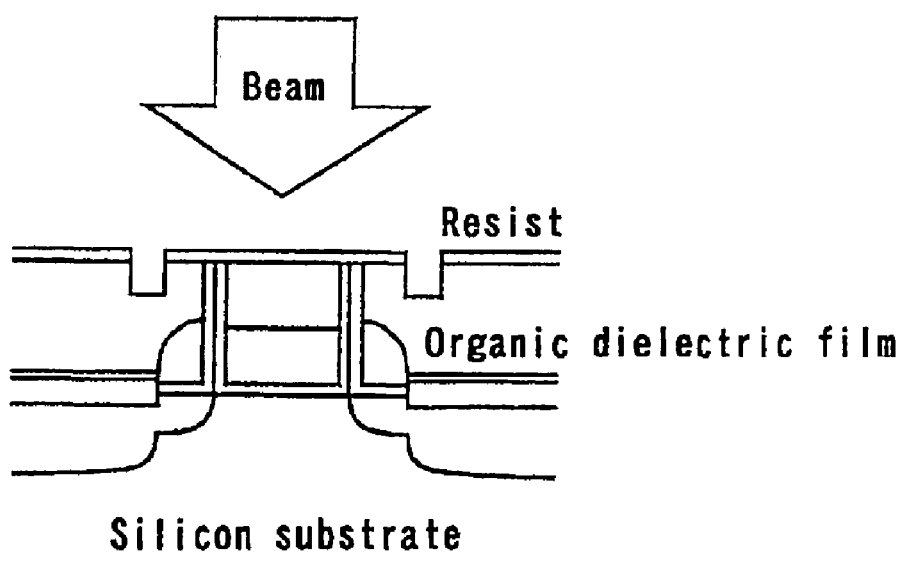
FIG. 8 is a schematic diagram explanatory of a process of etching an organic film in a fine pattern with the method of processing a surface of a workpiece according the present invention.

FIG. 8 is a schematic diagram explanatory of a process of etching an organic film in a fine pattern according to the method of the present invention. In an etching process of an dielectric film made of polyimide or an organic material having a low dielectric constant in a fine pattern, a sidewall in a workpiece is adversely etched by radicals. When an ordinary high-density plasma is used, a film of carbon polymer or nitride is deposited on the sidewall in the workpiece. The deposited film tends to modify metallic interconnections to increase their resistance or degrade their migration resistance in a process of forming a metallic electrode after contact holes are formed in the workpiece by etching.

In FIG. 8, a positive ion beam and a negative ion beam are alternately extracted from a plasma and applied to a workpiece (silicon substrate), for thereby inactivating radicals. Therefore, the adverse effects caused by radicals can be reduced. Further, a charge build-up can also be reduced by the alternate application of the positive ion beam and the negative ion beam, and the path of the ion beam can be collimated. The same advantages can be achieved by using a neutral particle beam which is generated by neutralizing positive ions, negative ions, or positive and negative ions.

In the above embodiment, the plasma is generated with use of a coil for ICP. However, the plasma may be generated with use of an electron cyclotron resonance source (ECR source), a coil for helicon wave plasma, a microwave, or the like.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a method of processing a surface of a workpiece in micromachining processes involved in the fabrication of semiconductor devices or the like.

What is claimed is:

1. A method of processing a surface of a workpiece, comprising:
   generating positive ions and negative ions in a plasma;
   selectively extracting the generated positive ions and negative ions from said plasma, and accelerating the extracted ions in a predetermined direction; and
   selectively applying said positive ions and said negative ions to said workpiece.

2. A method of processing a surface of a workpiece according to claim 1, wherein said generating comprises:
   applying a high-frequency voltage to a process gas in a vacuum chamber for generating a plasma which is composed of positive ions and electrons from said process gas;
   interrupting said high-frequency voltage for attaching said electrons to the residual process gas to generate negative ions; and
   repeating the application of said high-frequency voltage and the interruption of said high-frequency voltage.

3. A method of processing a surface of a workpiece according to claim 1, wherein said generating comprises:
   generating a plasma which is composed of positive ions and electrons from a process gas in a vacuum chamber; and
   attaching said electrons to the residual process gas to generate negative ions at a downstream part of a plasma generated space.

4. A method of processing a surface of a workpiece according to claim 1, wherein said positive ions and said negative ions are alternately extracted from said plasma and alternately applied to said workpiece.

5. A method of processing a surface of a workpiece according to claim 1, wherein said ions are applied to said workpiece while said workpiece is being shielded from a radiation produced by said plasma.

6. A method of processing a surface of a workpiece according to claim 1, wherein said workpiece comprises a semiconductor device, and said ions are applied to said semiconductor device for forming a gate dielectric film thereon.

7. A method of processing a surface of a workpiece according to claim 1, wherein said workpiece comprises an organic material, and said ions are applied to said organic material for etching said organic material.

8. A method of processing a surface of a workpiece, comprising:
   generating positive ions and negative ions in a plasma;
   selectively extracting the generated negative ions from said plasma, and accelerating the extracted negative ions in a predetermined direction; and
   applying said negative ions to said workpiece.

9. A method of processing a surface of a workpiece according to claim 8, wherein said negative ions are applied to said workpiece while said workpiece is being shielded from a radiation produced by said plasma.

10. A method of processing a surface of a workpiece according to claim 8, wherein said workpiece comprises a semiconductor device, and said negative ions are applied to said semiconductor device for forming a gate dielectric film thereon.

11. A method of processing a surface of a workpiece according to claim 8, wherein said workpiece comprises an organic material, and said negative ions are applied to said organic material for etching said organic material.

12. A method of processing a surface of a workpiece, comprising:
   generating positive ions and negative ions in a plasma;
   alternately extracting the generated positive ions and negative ions from said plasma, and accelerating the extracted ions in a predetermined direction;
   neutralizing the accelerated ions to convert them into neutral particles with use of a neutralization device; and
   applying said neutral particles to said workpiece while shielding said workpiece from a radiation produced by said plasma with use of said neutralization device.

13. A method of processing a surface of a workpiece according to claim 12, wherein said workpiece comprises a semiconductor device, and said neutral particles are applied to said semiconductor device for forming a gate dielectric film thereon.

14. A method of processing a surface of a workpiece according to claim 12, wherein said workpiece comprises an organic material, and said neutral particles are applied to said organic material for etching said organic material.

15. A method of processing a surface of a workpiece, comprising:
   generating positive ions and negative ions in a plasma;
   selectively extracting the generated negative ions from said plasma, and accelerating the extracted negative ions in a predetermined direction;
   neutralizing the accelerated negative ions to convert them into neutral particles with use of a neutralization device; and
   applying said neutral particles to said workpiece while shielding said workpiece from a radiation produced by said plasma with use of said neutralization device.

16. A method of processing a surface of a workpiece according to claim 15, wherein said workpiece comprises a semiconductor device, and said neutral particles are applied to said semiconductor device for forming a gate dielectric film thereon.

17. A method of processing a surface of a workpiece according to claim 15, wherein said workpiece comprises an organic material, and said neutral particles are applied to said organic material for etching said organic material.

* * * * *